United States Patent
Hatwar

(10) Patent No.: US 6,696,177 B1
(45) Date of Patent: Feb. 24, 2004

(54) WHITE ORGANIC ELECTROLUMINESCENT DEVICES WITH IMPROVED STABILITY AND EFFICIENCY

(75) Inventor: Tukaram K. Hatwar, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 47 days.

(21) Appl. No.: 09/651,624

(22) Filed: Aug. 30, 2000

(51) Int. Cl.$^7$ ............................................. H05B 33/14

(52) U.S. Cl. ..................... 428/690; 428/917; 313/504; 313/506; 257/88; 257/89; 257/98

(58) Field of Search ................. 428/690, 917; 257/102, 101, 88, 89, 98; 313/503, 504, 506; 252/301.16

(56) References Cited

U.S. PATENT DOCUMENTS

| | | | |
|---|---|---|---|
| 4,539,507 A | | 9/1985 | VanSlyke et al. |
| 4,769,292 A | | 9/1988 | Tang et al. |
| 4,885,211 A | | 12/1989 | Tang et al. |
| 5,059,062 A | | 10/1991 | Bresnahan |
| 5,059,862 A | * | 10/1991 | VanSlyke et al. ............ 313/503 |
| 5,405,709 A | | 4/1995 | Littman et al. |
| 5,503,910 A | * | 4/1996 | Matsuura et al. ............ 428/212 |
| 5,683,823 A | | 11/1997 | Shi et al. |
| 5,776,622 A | | 7/1998 | Hung et al. |
| 5,779,937 A | * | 7/1998 | Sano et al. ............. 252/301.16 |
| 5,792,557 A | * | 8/1998 | Nakaya et al. ............ 428/411.1 |
| 5,935,721 A | | 8/1999 | Shi et al. |
| 6,048,631 A | * | 4/2000 | Takahashi et al. ............ 428/690 |
| 6,091,196 A | * | 7/2000 | Codama .................. 313/504 |
| 6,225,467 B1 | * | 5/2001 | Esteghamatian et al. .... 544/180 |
| 6,251,531 B1 | * | 6/2001 | Enokida et al. ............. 428/690 |
| 6,288,486 B1 | * | 9/2001 | Tsuruoka et al. |

FOREIGN PATENT DOCUMENTS

JP  07142169  6/1995

OTHER PUBLICATIONS

"Multilayer White Light–Emitting Organic Electroluminescent Device" by Junji Kido et al., Scienc vol. 267, Mar. 3, 1995, p. 1332–1334.

"White light–emitting organic electroluminescent devices using the poly(N–vinylcarbazole) emi layer doped with three fluorescent dyes", by J. Kido et al., Applied Phys. Letter vol. 64 (7), Feb. 1994, p. 815–817.

"White–light–emitting organic electroluminescent devices based on interlayer sequential energy transfer", by R. Deshpande et al, Applied Physics Letters, vol. 75, No. 7, Aug. 16, 1999, p. 8 890.

"Semitransparent Cathodes for organic light emitting devices", by P. E. Burrows et al, J. Appl. Phy 87, No. 6, Mar. 15, 2000, p. 3080–3085.

(List continued on next page.)

*Primary Examiner*—Cynthia H. Kelly
*Assistant Examiner*—Dawn Garrett
(74) *Attorney, Agent, or Firm*—Raymond L. Owens

(57) ABSTRACT

An organic light-emitting diode (OLED) device which produces substantially white light includes a substrate; an anode disposed over the substrate; and a hole-injecting layer disposed over the anode. The device also includes a hole transport layer disposed over the hole-injecting layer; a light-emitting layer doped with a blue light-emitting compound, disposed directly on the hole transport layer; and an electron transport layer disposed over the blue light-emitting layer. The device further includes a cathode disposed over the electron transport layer and the hole transport layer, electron transport layer, or the electron transport layer and the hole transport layer being selectively doped in a region which corresponds to an entire layer or a partial portion of a layer in contact with the blue light-emitting layer, the selective doping being with a compound which emits light in the yellow region of the spectrum.

68 Claims, 10 Drawing Sheets

OTHER PUBLICATIONS

"Transparent organic light emitting devices" by G. Gu et al., Applied Phys. Letter 68 (19), May 6, 1996, p. 2606–2608.

"A metal–free cathode for organic semiconductor devices" by G. Parthasarathy et al., Applied Phys letter, vol. 72, No. 17, Apr. 27, 1998, p. 2138–2140.

"High–efficiency transparent organic light–emitting devices" by G. Parthasarathy et al., Applied Physics Letter vol. 76, No. 15, p. 2128–2130.

"Interface engineering in preparation of organic surface–emitting diodes", by L. S. Hung et al., Applied Physics Letter, vol. 74, No. 21, p. 3209–3211.

"Red organic light–emitting diodes using and emitting assist dopant", by Yuji Hamada et al., Applied Phys. Lett. vol. 75, No. 12, p. 1682–1684.

* cited by examiner

WHITE ORGANIC ELECTROLUMINESCENT DEVICES WITH IMPROVED STABILITY AND EFFICIENCY

FIELD OF THE INVENTION

The present invention relates to organic light-emitting devices (OLED) which produce white light.

BACKGROUND OF THE INVENTION

An OLED device includes a substrate, an anode, a hole-transporting layer made of an organic compound, an organic luminescent layer with suitable dopants, an organic electron transport layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Efficient white light producing OLED devices are considered low cost alternative for several applications such as paper-thin light source backlights in LCD displays, automotive dome lights, and office lighting. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

The following patents and publications disclose the preparation of organic OLED devices capable of emitting white light, comprising a hole transport layer and an organic luminescent layer, and interposed between a pair of electrodes.

White light producing OLED devices have been reported before by J. Shi (U.S. Pat. No. 5,683,823) wherein the luminescent layer includes a red and blue light-emitting materials uniformly dispersed in a host emitting material. This device has good electroluminescent characteristics, but the concentration of the red and blue dopants are very small such as 0.12% and 0.25% of the host material. These concentrations are difficult to control during large-scale manufacturing.

Sato et al. in JP 07,142,169 discloses an OLED device capable of emitting white light made by sticking a blue light-emitting layer next to the hole transporting layer and followed by a green light-emitting layer having a region containing a red fluorescent layer.

Kido et al., in Science, Vol. 267, p. 1332 (1995) and in APL Vol. 64, p. 815 (1994), report a white light producing OLED device. In this device three emitter layers with different carrier transport properties, each emitting blue, green or red light, are used to generate white light.

Littman et al. in U.S. Pat. No. 5,405,709 disclose another white emitting device which is capable of emitting white light in response to hole-electron recombination and comprises a fluorescent in a visible light range from bluish green to red.

Recently, Deshpande et al, in Applied Physics Letters, vol. 75, p. 888 (1999) published white OLED device using red, blue and green luminescent layers separated by a hole blocking layer.

However, these OLED devices require a very small amount of dopant concentrations, making the process difficult to control for large-scale manufacturing. Also emission color varies due to small changes in the dopant concentration.

SUMMARY OF THE INVENTION

It is an object of the present invention to produce an effective white light-emitting organic device.

It is another object of this invention to provide an efficient and stable white light producing OLED device with simple structure and which can be reproduced in manufacturing environment.

It has been found quite unexpectedly that white light producing OLED devices with high luminance efficiency and operational stability can be obtained by doping yellow dopant in the NPB hole transport layer and blue dopant in the ADN host emission layer.

It has also been found that by doping rubrene in the Alq electron transport layer and blue doping in the ADN host emission layer; white light can be produced.

The object is achieved by an organic light-emitting diode (OLED) device which produces substantially white light, comprising:
 a) a substrate;
 b) an anode disposed over the substrate;
 c) a hole-injecting layer disposed over the anode;
 d) a hole transport layer disposed over the hole-injecting layer;
 e) a light-emitting layer doped with a blue light-emitting compound, disposed directly on the hole transport layer;
 f) an electron transport layer disposed over the blue light-emitting layer;
 g) a cathode disposed over the electron transport layer; and
 h) the hole transport layer, electron transport layer, or the electron transport layer and the hole transport layer being selectively doped in a region which corresponds to an entire layer or a partial portion of a layer in contact with the blue light-emitting layer, the selective doping being with a compound which emits light in the yellow region of the spectrum.

This object is further achieved by an organic light-emitting diode device which produce substantially white light, comprising:
 a) a substrate;
 b) an anode disposed over the substrate;
 c) a hole transport layer doped with a rubrene compound for emitting light in the yellow region of the spectrum;
 d) a light-emitting layer doped with a blue light-emitting compound, disposed directly on the hole transport layer;
 e) an electron transport layer doped with a rubrene compound for emitting light in the yellow region of the spectrum and disposed directly over the blue light-emitting layer; and
 f) a cathode disposed over the electron transport layer.

ADVANTAGES

The following are features and advantages of the present invention:
 a simplified OLED device for producing white light by having a yellow dopant in the hole transport layer, or the electron transport layer, or both; and
 an OLED device which is easy to control blue and yellow dopant concentrations since they are quite high (~2% TBP and ~2% rubrene).

OLED devices made in accordance with the present invention can be produced with high reproducibility and consistently provide high light efficiency (5.3 cd/A @20 mA/cm$^2$). These devices have high operational stability and also require low drive voltage.

DETAILED DESCRIPTION OF THE INVENTION

Figure 1:
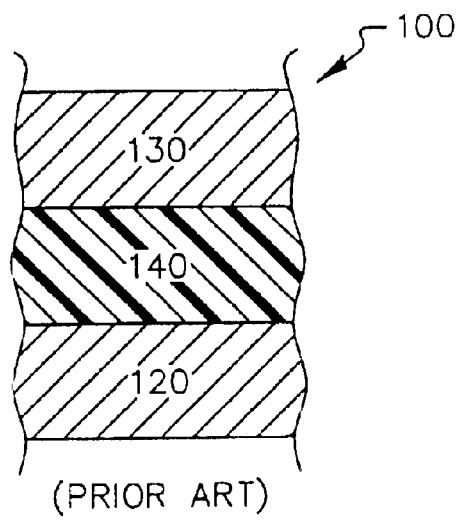
FIG. 1 depicts a prior art organic light-emitting device.

A conventional light-emitting layer of the organic OLED device comprises a luminescent or fluorescent material where electroluminescence is produced as a result of electron-hole pair recombination in this region. In the simplest construction OLED device 100, as shown in FIG. 1, a light-emitting layer 140 is sandwiched between anode 120 and cathode 130. The light-emitting layer 140 is a pure material with a high luminescent efficiency. A well known material is tris(8-quinolinato) aluminum (Alq) which produces excellent green electroluminescence.

Figure 2:
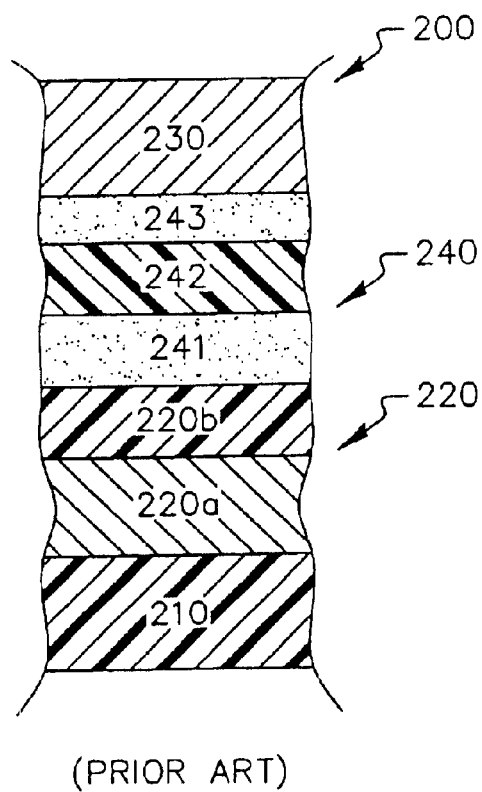
FIG. 2 depicts another prior art organic light-emitting device.

The simple structure can be modified to a three-layer structure as shown in FIG. 2, in which an additional electroluminescent layer is introduced between the hole and electron-transporting layers to function primarily as the site for hole-electron recombination and thus electroluminescence. In this respect, the functions of the individual organic layers are distinct and can therefore be optimized independently. Thus, the electroluminescent or recombination layer can be chosen to have a desirable OLED color as well as high luminance efficiency. Likewise, the electron and hole transport layers can be optimized primarily for the carrier transport property. It will be understood to those skilled in the art that the electron transport layer and the cathode can be made to be transparent thus facilitating illumination of the device through its top layer and not through the substrate.

Turning to FIG. 2, an organic light-emitting device 200 has a light-transmissive substrate 210 on which is disposed a light-transmissive anode 220. The anode 220 comprises of two layers 220a and 220b. An organic light-emitting structure 240 is formed between the anode 220 and a cathode 230. The organic light-emitting structure 240 is comprised of, in sequence, an organic hole-transporting layer 241, an organic light-emitting layer 242, and an organic electron-transporting layer 243. When an electrical potential difference (not shown) is applied between the anode 220 and the cathode 230, the cathode will inject electrons into the electron-transporting layer 243, and the electrons will migrate across layer 243 to the light-emitting layer 242. At the same time, holes will be injected from the anode 220 into the hole-transporting layer 241. The holes will migrate across layer 241 and recombine with electrons at or near a junction formed between the hole-transporting layer 241 and the light-emitting layer 242. When a migrating electron drops from its conduction band to a valance band in filling a hole, energy is released as light, and which is emitted through the light-transmissive anode 220 and substrate 210.

The organic OLED devices can be viewed as a diode, which is forward biased when the anode is at a higher potential than the cathode. The anode and cathode of the organic OLED device can each take any convenient conventional form, such as any of the various forms disclosed by Tang et al. U.S. Pat. No. 4,885,211. Operating voltage can be substantially reduced when using a low-work function cathode and a high-work function anode. The preferred cathodes are those constructed of a combination of a metal having a work function less than 4.0 eV and one other metal, preferably a metal having a work function greater than 4.0 eV. The Mg:Ag of Tang et al. U.S. Pat. No. 4,885,211 constitutes one preferred cathode construction. The Al:Mg cathodes of Van Slyke et al. U.S. Pat. No. 5,059,862 is another preferred cathode construction. Hung et al. in U.S. Pat. No. 5,776,622 have disclosed the use of a LiF/Al bilayer to enhanced electron injection in organic OLED devices. Cathodes made of either Mg:Ag, Al:Mg or LiF/Al are opaque and displays cannot be viewed through the cathode. Recently, a series of publications (Gu et al. in APL 68, 2606 [1996]; Burrows et al, J. Appl. Phys. 87, 3080 (2000); Parthasarathy et al. APL 72, 2138 9198; Parthasarathy et al. APL 76, 2128 [2000], Hung et al. APL, 3209 [1999]) have disclosed transparent cathode. Cathode based on the combination of thin semitransparent metal (~100A) and indium-tin-oxide (ITO) on top of the metal. An organic layer of copper phthalocyanine (CuPc) also replaced thin metal.

Conventional anodes 220a are formed of a conductive and transparent oxide. Indium tin oxide has been widely used as the anode contact because of its transparency, good conductivity, and high work function.

In a preferred embodiment, an anode 220a can be modified with a hole injection layer 220b. An example of material in such a hole injection layer are the fluorocarbons disclosed by Hung U.S. patent application Ser. No. 09/186,829 filed Nov. 5, 1998, the disclosure of which is incorporated herein by reference.

The light-transmissive substrate 210 may be constructed of glass, quartz, or a plastic material.

Preferred materials for use in forming the hole transport layer of the organic OLED devices are tertiary amines as taught in Van Slyke U.S. Pat. No. 4,539,507. Another class of preferred amines is tetraaryl amines. Preferred tetraaryldiamines include two diarylamino groups, such as indicated by formula (III), linked through an arylene group. Preferred tetraaryldiamines include those represented by formula:

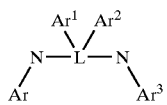
(III)

wherein,
Ar, $Ar^1$, $Ar^2$ and $Ar^3$ are independently selected from among phenyl, biphenyl and naphthyl moieties,
L is a divalent naphthylene moiety or $d_n$,
d is a phenylene moiety,
n is an integer of from 1 to 4, and
at least one of Ar, $Ar^1$, $Ar^2$ and $Ar^3$ is a naphthyl moiety when L is $d_n$.

The various alkyl, alkylene, aryl, and arylene moieties of the foregoing structural formulae (I), (II), (III), and (IV) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g. cyclopentyl, cyclohexyl, and cycloheptyl ring structures. When the aryl and arylene moieties are not fused aromatic ring moieties, they are preferably phenyl and phenylene moieties.

Illustrative of useful selected (fused aromatic ring containing) aromatic tertiary amines (ATA) are the following:

ATA-1 4,4'-Bis[N-(1-naphthyl)-N-phenylamino]biphenyl (NPB)
ATA-2 4,4"-Bis[N-(1-naphthyl)-N-phenylamino]-p-terphenyl
ATA-3 4,4'-Bis[N-(2-naphthyl)-N-phenylamino]biphenyl
ATA-4 4,4'-Bis[N-(3-acenaphthenyl)-N-phenyl-amino]biphenyl
ATA-5 1,5-Bis[N-(1-naphthyl)-N-phenylamino]naphthalene
ATA-6 4,4'-Bis[N-(9-anthryl)-N-phenylamino]-biphenyl
ATA-7 4,4"-Bis[N-(1-anthryl)-N-phenylamino]-p-terphenyl
ATA-8 4,4'-Bis[N-(2-phenanthryl)-N-phenyl-amino]biphenyl
ATA-9 4,4'-Bis[N-(8-fluoranthenyl)-N-phenyl-amino]biphenyl
ATA-10 4,4'-Bis[N-(2-pyrenyl)-N-phenylamino]bi-phenyl
ATA-11 4,4'-Bis[N-(2-naphthacenyl)-N-phenyl-amino]biphenyl
ATA-12 4,4'-Bis[N-(2-perylenyl)-N-phenylamino]biphenyl
ATA-13 4,4'-Bis[N-(1-coronenyl)-N-phenylamino]biphenyl
ATA-14 2,6-Bis(di-p-tolylamino)naphthalene
ATA-15 2,6-Bis[di-(1-naphtyl)amino]naphthalene
ATA-16 2,6-Bis[N-(1-naphthyl)-N-(2-naphthyl)-amino]naphthalene
ATA-17 N,N,N',N'-Tetra(2-naphthyl)-4,4"-di-amino-p-terphenyl
ATA-18 4,4'-Bis{N-phenyl-N-[4-(1-naphthyl)-phenyl]amino}biphenyl
ATA-19 4,4'-Bis[N-phenyl-N-(2-pyrenyl)amino]biphenyl
ATA-20 2,6-Bis[N,N-di(2-naphthyl)amine]fluorene
ATA-21 1,5-Bis[N-(1-naphthyl)-N-phenylamino]naphthalene

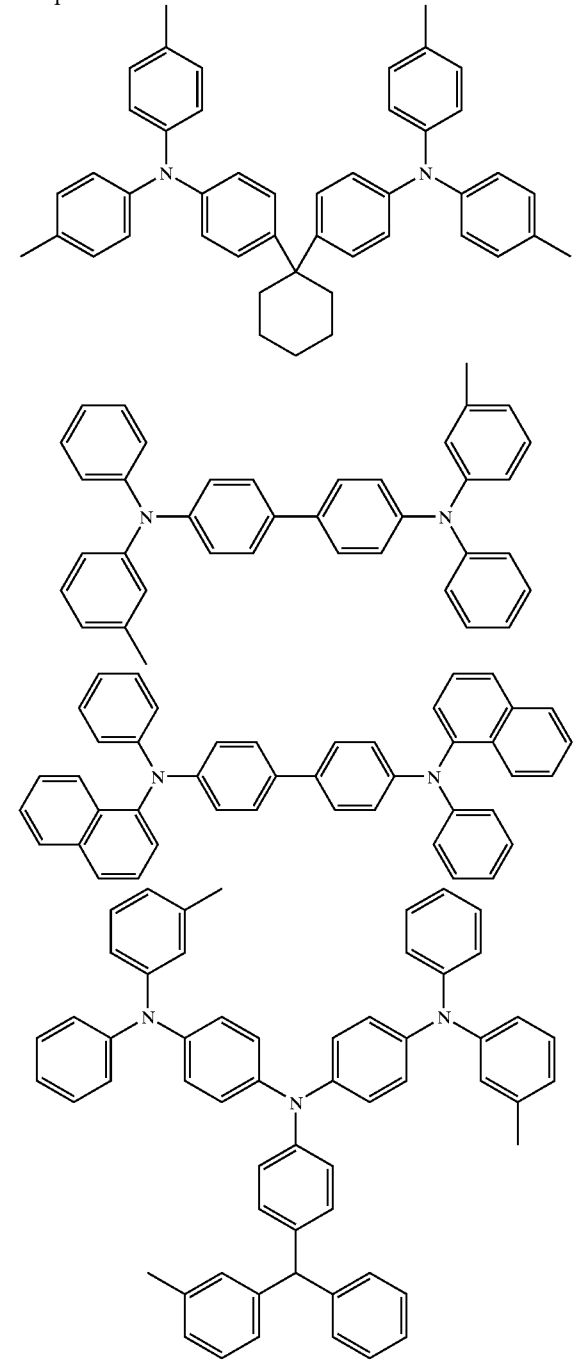

Preferred materials for use in forming the electron-transporting layer of the organic OLED devices of this invention are metal chelated oxinoid compounds, including chelates of oxine itself (also commonly referred to as 8-quinolinol or 8-hydroxyquinoline) as disclosed in U.S. Pat. No. 4,885,211. Such compounds exhibit both high levels of performance and are readily fabricated in the form of thin layers. The electron transport layer also can be made of porphyrinic compound as disclosed in U.S. Pat. No.

5,683,823. Highly preferred examples of useful porphyrinic compounds are metal free phthalocyanines and metal containing phthalocyanines. Illustrative of useful porphyrinic compound is copper phthalocyanine (CuPc).

A preferred embodiment of the luminescent layer consists of a host material doped with fluorescent dyes. Using this method, highly efficient EL devices can be constructed. Simultaneously, the color of the EL devices can be tuned by using fluorescent dyes of different emission wavelengths in a common host material. Tang et al., in commonly assigned U.S. Pat. No. 4,769,292, have described this dopant scheme in considerable details for EL devices using Alq as the host material.

Shi et al., in commonly assigned U.S. Pat. No. 5,935,721, have described this dopant scheme in considerable details for the blue emitting OLED devices using 9,10-di-(2-naphthyl)anthracene (ADN) derivatives as the host material.

Preferred host materials for the blue luminescent layer of this invention include:

a) ADN

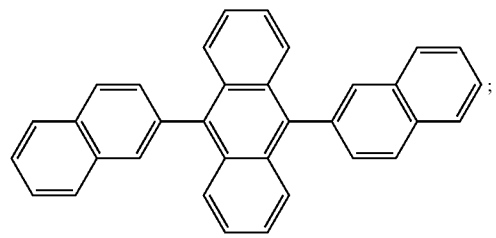

or b) tertiary butyl ADN

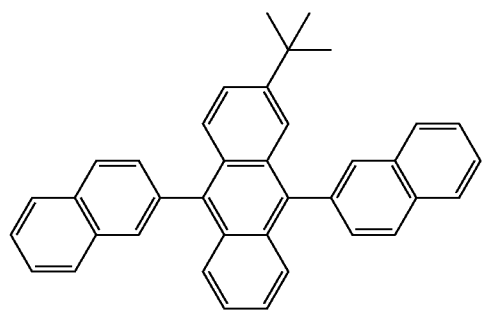

The following is the list of blue fluorescent dopants that are contemplated for use in the practice of this invention.

i) perylene

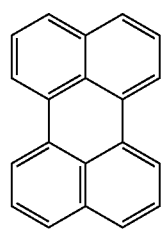

ii) 2,5,8,11-tetra-tert-butyl perylene

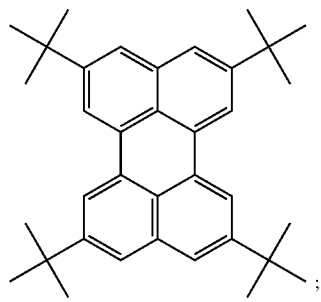

and iii) other conjugated benzenoids such as

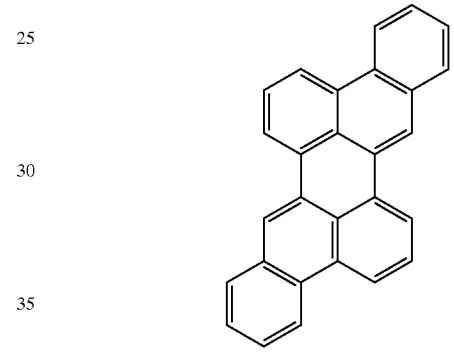

Preferred materials for uses as a yellow dopant in the emission layer are rubrene class materials. These are hydrocarbon compound containing a polycyclic benzoid chromophoric unit. Hamada et al. reported in Applied Phys. Lett. Vol. 75, 1682 (1999) a red color emitting OLED device by doping rubrene in hole transport layer and DCM2 dopants into Alq emission layer.

Some of the rubrene class materials and their ionization potentials are given below.

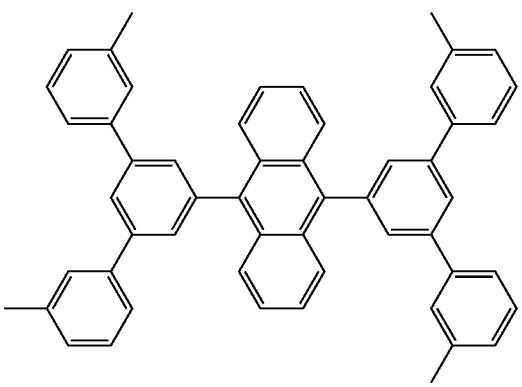

-continued

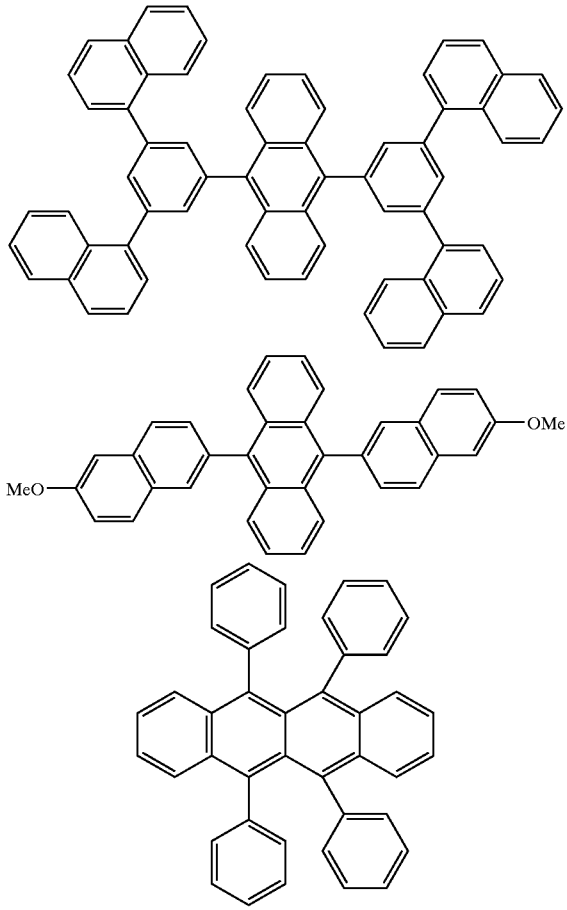

The invention and its advantages are further illustrated by the specific examples which follow. The term "percentage" indicates the weight percentage of a particular dopant with respect to the host material.

FIGS. 3–11 shows the white light producing OLED device structure prepared according to the present invention and graphs of various parameters of their operations. The invention and its advantages are further illustrated by the specific examples, which follow.

Figure 3:
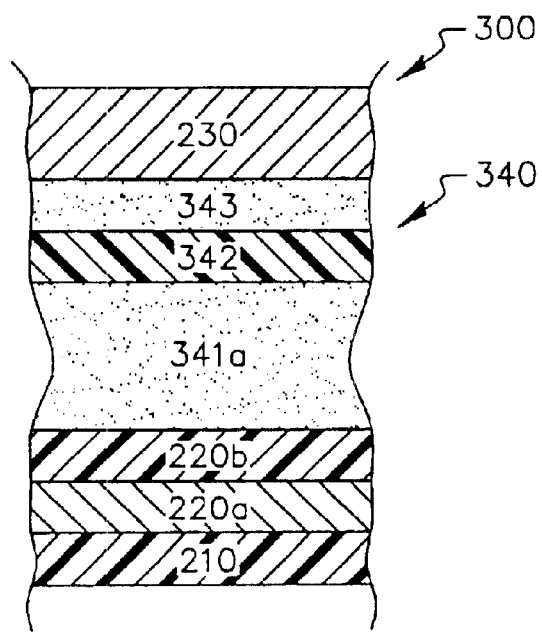
FIG. 3 depicts a white light producing OLED device wherein the hole transport layer is doped with rubrene yellow dopant.

Turning to FIG. 3, an organic white light-emitting device 300 has a light-transmissive substrate 210 on which is disposed a light-transmissive anode 220 which are the same as shown in FIG. 2. An organic white light-emitting structure 340 is formed between the anode 220 and a cathode 230. The organic light-emitting structure 340 is comprised of, in sequence, an organic hole-transporting layer 341a which doped with rubrene yellow dopant. An organic light-emitting layer 342 is blue emitting layer comprising ADN host and TBP dopant. An organic electron-transporting layer 343 is made of Alq.

Figure 4:
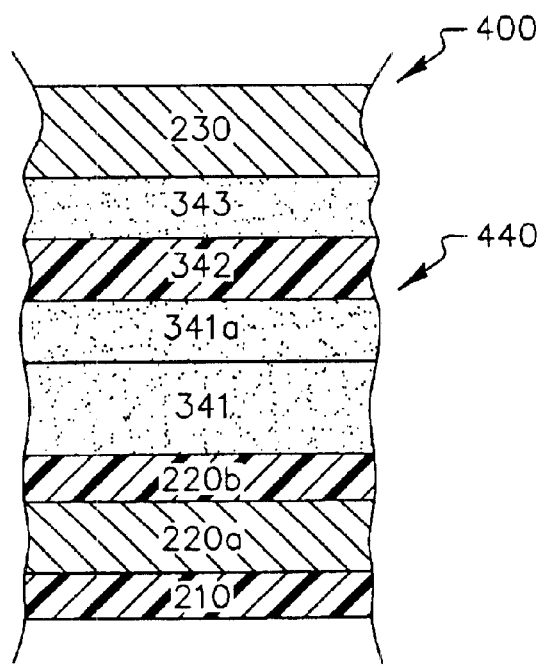
FIG. 4 depicts another structure of white light producing OLED device wherein the hole transport layer is doped with rubrene yellow dopant.

FIG. 4 depicts an organic white light-emitting OLED device 400 that has an organic multilayer structure 440 which is similar to that shown in the organic multilayer structure 340 in FIG. 3, except that the organic hole-transporting layer consists of two layers, layer 341 which is made of undoped NPB and layer 341a which doped with rubrene yellow dopant.

EXAMPLE 1

An OLED device was constructed in the following manner:

Substrates coated with 80 nm ITO were sequentially ultrasonicated in a commercial detergent, rinsed in deionized water, and degreased in toluene vapor. These substrates were treated with an oxygen plasma for about 1 minute and coated with 1 nm fluorocarbon layer by plasma assisted deposition of $CHF_3$. The same procedure was used for preparing all other devices described in this invention.

These substrates were loaded into a deposition chamber for organic layers and cathode depositions.

Device A was prepared by sequential deposition of 150 nm NPB hole transporting layer (HTL), 20 nm blue emission layer (EML) comprising ADN host with 1.5% TBP blue dopant, 37.5 nm Alq electron transport layer (ETL), then 0.5 nm LiF and 200 nm Al as a part of cathode. The above sequence completed the deposition of the OLED device.

The OLED device was then hermetically packaged in a dry glove box filled with nitrogen for protection against ambient environment. The ITO patterned substrates used for preparing these OLED devices contained several test patterns. Each of the device was tested for current voltage characteristics and the electroluminescence yield.

Devices B, C, D, E and F were prepared following the same sequence as Device A except that 150 nm NPB hole transport layer was doped with varying amount of rubrene concentrations: (B) 0.3%, (C) 0.5%, (D) 1%, (E) 2% and (F) 5% respectively. It was found that the device A has emission in the blue region of the electromagnetic spectrum, while the emission from devices B to C changed towards blue-white color. Device D and E have white emissions, while the emission from device F has shifted towards white orange. Thus, it was possible to produce white color light at optimum rubrene concentration in the NPB hole transport layer.

Figure 5:
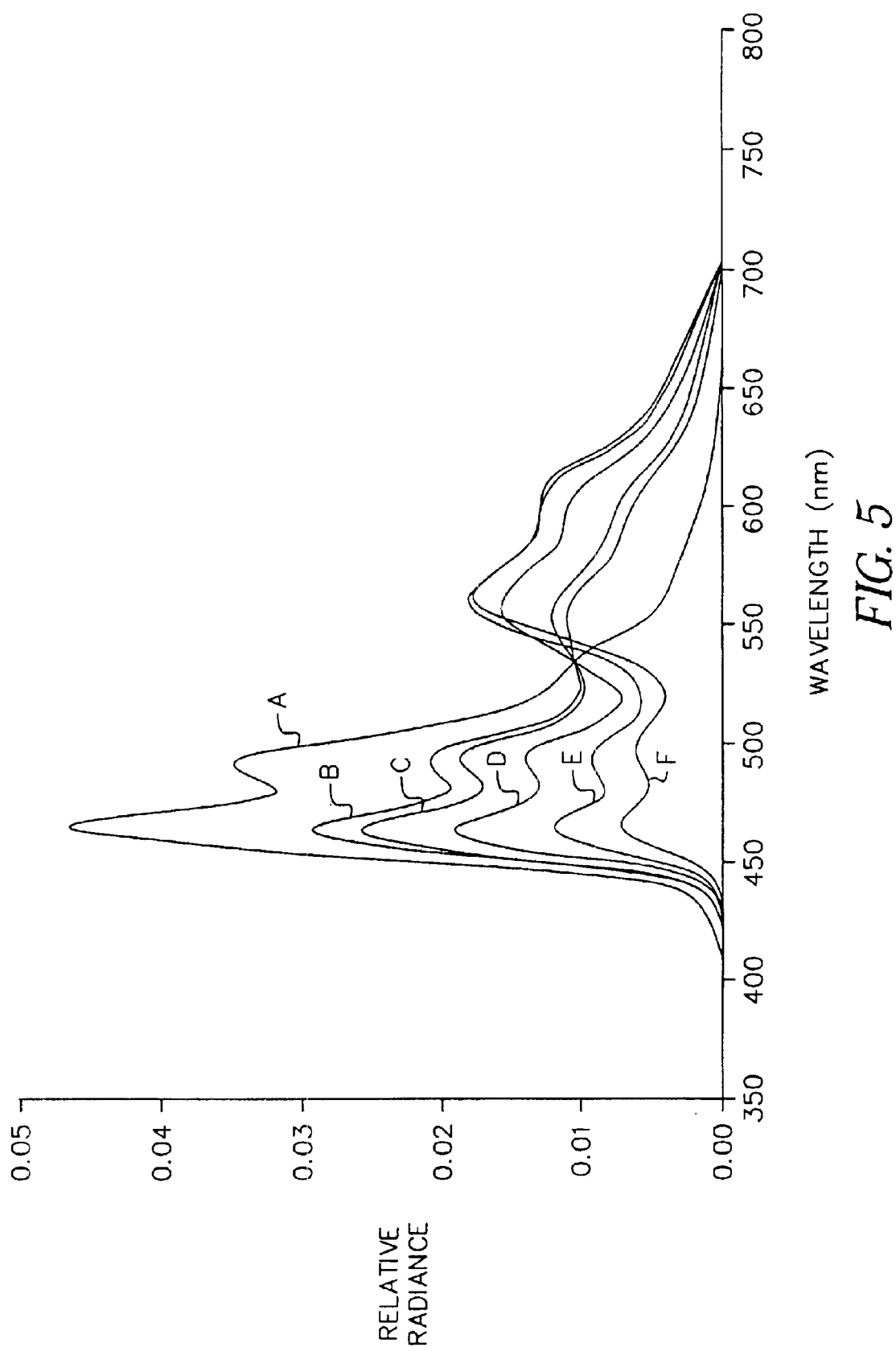
FIG. 5 shows EL spectral distribution as a function of rubrene doping into a hole transport layer.

FIG. 5 shows the EL spectra of these devices A to F wherein rubrene concentration was increased from 0 to 5% in the hole transport NPB layer. The blue emission layer consists of 1.5% TBP doped in the ADN host. White color with CIE coordinates (0.33, 0.38) is obtained with luminance efficiency greater than 4.2 cd/A @20 $mA/cm^2$ when the rubrene concentration is about 1.5–2%. Thus, much higher concentrations of rubrene yellow dopant and TBP blue doping can be used. The luminance efficiency and the CIE coordinates as a function of rubrene concentration for devices A to F are shown in Table 1. Device D has luminance yield of 4.3 cd/A and color chromaticity coordinates of CIE x,y=0.33, 0.38 @20 $mA/cm^2$ current density. This is an important feature of this invention in that doping rubrene in the NPB hole transport layer adjacent to a blue light emission layer can produce white light OLED.

It was found that the thickness of the rubrene yellow doped region of the NPB hole transport layer adjacent to the blue emission layer can be as thin as about 2 nm for obtaining the white color. Several devices were prepared following the device structure shown in FIG. 4. Thickness of the undoped NPB hole transport layer 341 and the rubrene doped NPB hole transport layer 341a were varied between 120 to 150 nm and 30 to 0 nm, respectively, to find the thickness of the rubrene doped HTL layer.

TABLE 1

Electroluminace characteristics of White OLED by rubrene doping into HTL layer

| Device # | Hole transport layer | Blue emission layer | Electron transport layer | Cathode | Drive Voltage (V) | Luminance Yield (cd/A) | CIEx | CIEy | Color |
|---|---|---|---|---|---|---|---|---|---|
| A | 150 nm NPB | 20 nm ADN + 1.5% TBP | 35 nm Alq | 200 nm MgAg | 8.8 | 2.88 | 0.166 | 0.253 | Blue |
| B | 150 nm NPB + 0.3% Rubrene | 20 nm ADN + 1.5% TBP | 35 nm Alq | 200 nm MgAg | 8.4 | 3.61 | 0.245 | 0.324 | Blue |
| C | 150 nm NPB + 0.5% rubrene | 20 nm ADN + 1.5% TBP | 35 nm Alq | 200 nm MgAg | 8.2 | 3.69 | 0.267 | 0.34 | Blue-White |
| D | 150 nm NPB + 1% rubrene | 20 nm ADN + 1.5% TBP | 35 nm Alq | 200 nm MgAg | 8.3 | 4.22 | 0.328 | 0.385 | White |
| E | 150 nm NPB + 2% Rubrene | 20 nm ADN + 1.5% TBP | 35 nm Alq | 200 nm MgAg | 8.5 | 4.29 | 0.383 | 0.421 | White |
| F | 150 nm NPB + 5% Rubrene | 20 nm ADN + 1.5% TBP | 35 nm Alq | 200 nm MgAg | 8.5 | 3.96 | 0.422 | 0.443 | White-Orange |

It was also found that that the rubrene doped region of the NPB hole transport layer 341a should be in close contact with the blue luminescent layer 342 for obtaining high efficiency white light producing OLED devices as illustrated from the following Example 2.

TABLE 2

White OLED defining the positions of the Rubrene doped NPB HTL and Blue emission layers

| Device # | HTL layer | NPB undoped layer | Blue emission layer | Electron transport layer | Cathode | Drive Volt. (V) | Luminance Yield (cd/A) | CIEx | CIEy | Color |
|---|---|---|---|---|---|---|---|---|---|---|
| G | 120 nm NPB undoped/30 nm NPB + 1.5% Rub doped | 0 nm | 20 nm ADN + 1.5% TBP | 35 nm Alq | 200 nm MgAg | 8.5 | 4.54 | 0.359 | 0.399 | White |
| H | 118 nm NPB undoped/30 nm NPB + 1.5% Rubrene doped | 2 nm | 20 nm ADN + 1.5% TBP | 35 nm Alq | 200 nm MgAg | 8.6 | 3.84 | 0.221 | 0.28 | White-Blue |
| I | 115 nm NPB undoped/30 nm NPB + 1.5% Rubrene doped | 5 nm | 20 nm ADN + 1.5% TBP | 35 nm Alq | 200 nm MgAg | 8.1 | 3.02 | 0.189 | 0.262 | Blue |
| J | 110 nm NPB undoped/30 nm NPB + 1.5% Rubrene doped | 10 nm | 20 nm ADN + 1.5% TBP | 35 nm Alq | 200 nm MgAg | 8.5 | 3.09 | 0.162 | 0.233 | Blue |
| K | 103 nm NPB undoped/30 nm NPB + 1.5% Rubrene doped | 17 nm | 20 nm ADN + 1.5% TBP | 35 nm Alq | 200 nm MgAg | 8.6 | 3 | 0.16 | 0.231 | Blue |
| L | 90 NPB nm undoped/30 nm NPB + 1.5% Rubrene doped | 30 nm | 20 nm ADN + 1.5% TBP | 35 nm Alq | 200 nm MgAg | 8.6 | 2.82 | 0.161 | 0.231 | Blue |

EXAMPLE 2

OLED Devices G, H, I, J, K, L were prepared by inserting a undoped NPB between the rubrene doped NPB hole transport layer 341a and blue emission layer 342.

Table 2 shows the color coordinates and luminance efficiency variation of these devices where the thickness of the undoped NPB was varied between 0 to 30 nm. Luminance efficiency decrease rapidly when the thickness of the undoped region exceeds 2 nm. Further increase in the thickness of undoped NPB thickness greater than 10 nm results in blue color only indicating that the emission becomes confined to the blue emission layer.

Figure 6:
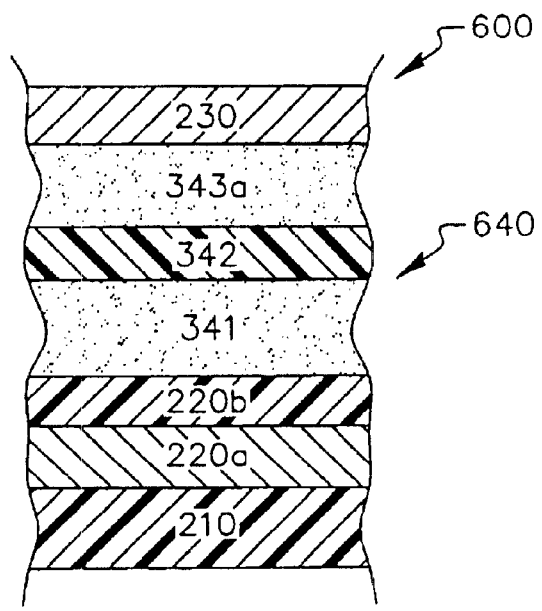
FIG. 6 depicts a white light producing OLED device wherein the electron transport layer is doped with rubrene yellow dopant.

It was found that a white producing OLED can also be made by doping yellow rubrene dopant into Alq electron transport layer adjacent to a blue light emission layer. FIG. 6 shows an organic white light-emitting OLED device 600. The layer numbers are the same as corresponding to FIG. 3. An organic white light-emitting structure 640 is formed between the anode 220 and a cathode 230. The white light-emitting structure 640 is comprised of, in sequence, an organic hole-transporting layer 341, an organic light-emitting layer 342 which is blue emitting layer comprising ADN host and TBP dopant, and an organic electron-transporting layer 343a is made of Alq and is doped with rubrene yellow dopant.

Figure 7:
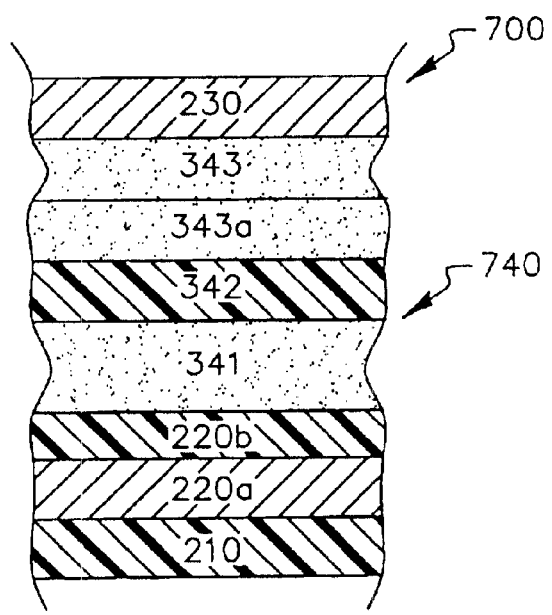
FIG. 7 depicts another structure of white light producing OLED device wherein the electron transport layer is doped with rubrene yellow dopant.

FIG. 7 depicts yet another structure of organic white light-emitting OLED device 700. This structure is similar to that shown in FIG. 6 except that the organic multilayer structure 740 has an electron-transporting layer consisting of two layers, layer 343a which is made of rubrene yellow doped Alq, and layer 343 which is undoped Alq.

EXAMPLE 3

Devices M to R were prepared following the structure as shown in FIG. 7. The deposition sequence was the same sequence as Device A except that first 20 nm Alq electron transport layer 243a was doped with varying amount of rubrene concentrations: (M) 0.0%, (N) 0.3%, (O) 0.5%, (P) 1%, (Q) 2% and (R) 5%, respectively. The rubrene doped Alq layer was followed by depositing 15 nm undoped Alq layer 343 making the total thickness of the Alq rubrene doped and undoped Alq layer equal to 37.5 nm. It was found that the devices M has emission in the blue region of the electromagnetic spectrum, while the emission from devices N and O changed towards blue white color. Device P, Q and R have white emission. Thus, it was possible to produce white color light at optimum rubrene concentration doping in the Alq electron transport layer and the blue emitting layer.

Figure 8:
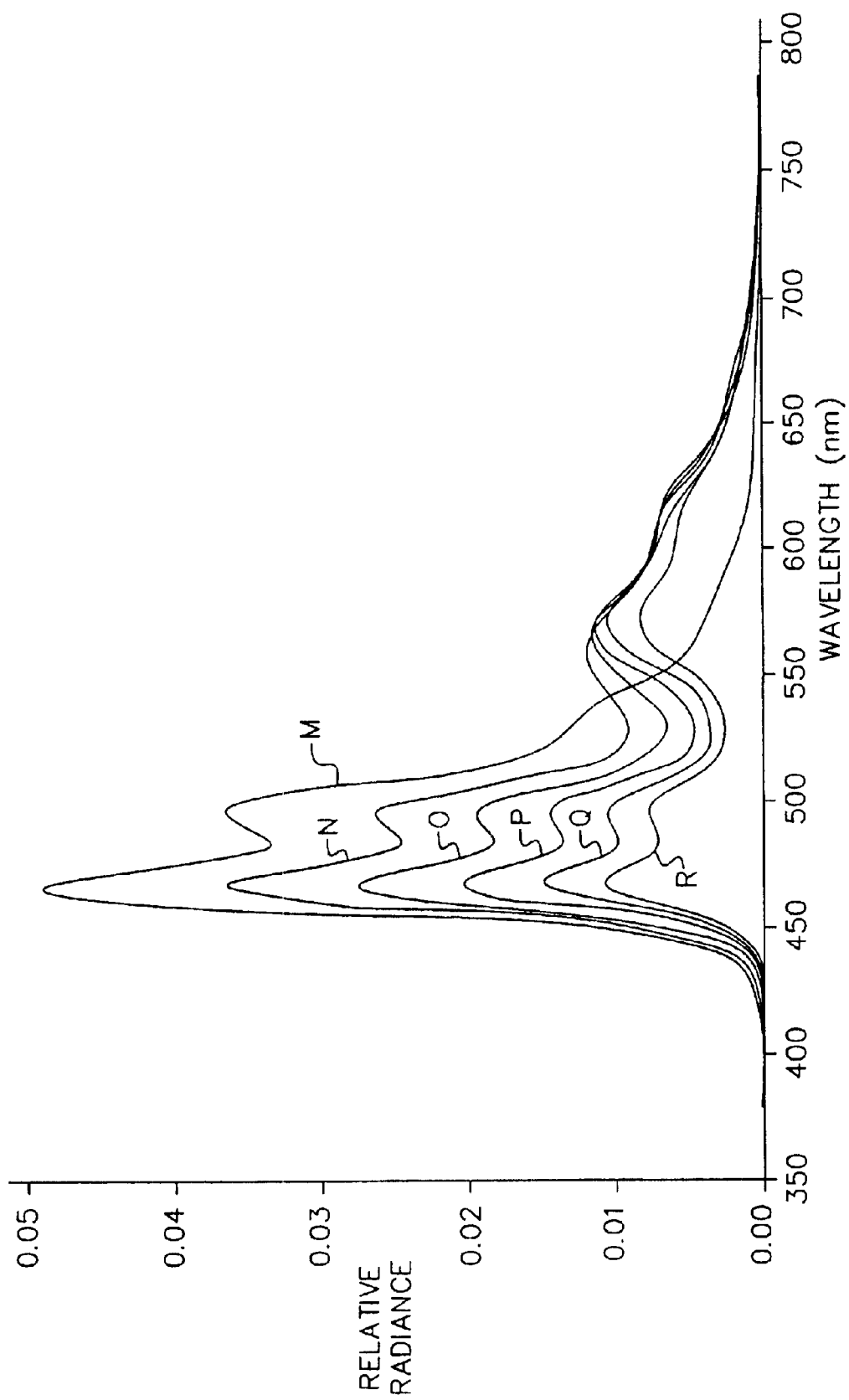
FIG. 8 shows a graph of EL spectral distribution as a function of rubrene doping into Alq electron transport layer.

FIG. 8 shows the EL spectra of these devices M to R wherein rubrene concentration was varied between 0–5% in the electron transport layer. The blue emission layer has 1.5% TBP doped in the ADN host. White color was obtained for the devices P, Q, R, wherein emission peaks from both blue and yellow region are clearly seen.

The luminance efficiency and the CIE coordinates as a function of rubrene concentration for devices M to R and are shown in Table 3. Devices P, Q, and R have luminance yield of 2.9 cd/A and color chromaticity coordinates of CIE x,y=0.33, 0.34 @20 mA/cm$^2$ current density, when the rubrene concentration is about 1.5–2%. However, luminance efficiency of these devices is smaller than those prepared by rubrene doping in the NPB hole transport layer, such as device D.

It was also found that the thickness of the rubrene yellow doped region of the Alq electron transport layer 343a can be as thin as about 2 nm for obtaining the white color. Several devices were prepared following the device structures shown in FIG. 6 and FIG. 7. Thickness of the rubrene doped Alq electron layer 343a and the undoped doped Alq electron layer 343 were varied between to find the close proximity and the thickness of the rubrene doped ETL layer.

342 and the rubrene doped Alq layer 341a. Table 4 shows the color coordinates and luminance efficiency variation of these devices where undoped Alq was varied between 0 to 10 nm. Luminance efficiency decrease rapidly when the thickness of the undoped region exceeds 5 nm. Further increase in the thickness of undoped Alq thickness greater than 10 nm results in blue color only that is from the blue emission layer.

Another important feature of this invention is that white light can be produced by an OLED by doping rubrene both in the NPB hole transport layer 341a and in the Alq electron transport layer 343a, and blue emitting layer 342. These devices have significantly higher luminance yield and higher operational stability as compared to those obtained by rubrene doping in either hole transport layer or the electron transport layer.

Figure 9:
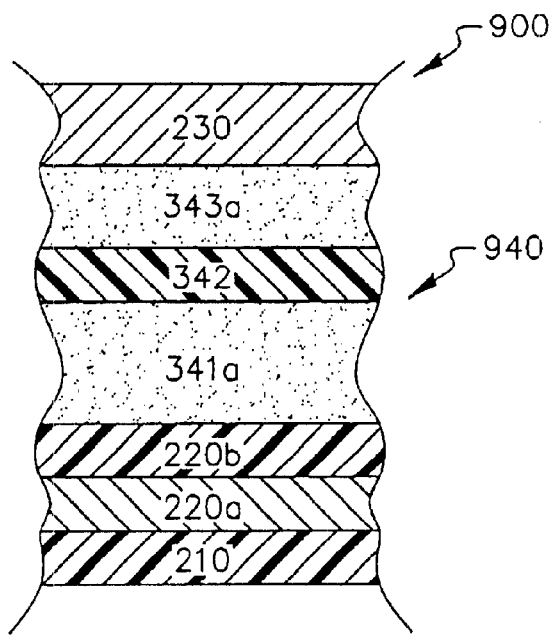
FIG. 9 depicts a white light producing OLED device wherein rubrene doping in both the hole transport layer and the electron transport layer.

FIG. 9 shows an organic white light-emitting OLED device 900 wherein rubrene was doped both in the hole transport 341a and the electron transport layer 343a. The

TABLE 3

Electrouminance characteristics of White OLED by Rubrene doping into electron transport layer

| Device # | HTL layer | Blue emission layer | ETL doped with Rubrene % | ETL undoped | Cathode | Drive Voltage (V) | Luminance Yield (cd/A) | CIEx | CIEy | Color |
|---|---|---|---|---|---|---|---|---|---|---|
| M | 150 nm NPB | 20 nm ADN + 1.5% TBP | 20 nm Alq | 15 nm Alq | 200 nm MgAg | 8.7 | 3.07 | 0.171 | 0.25 | Blue |
| N | 150 nm NPB | 20 nm ADN + 1.5% TBP | 20 nm Alq + 0.3% Rubrene | 15 nm Alq | 200 nm MgAg | 8.9 | 3.76 | 0.24 | 0.3 | Blue |
| O | 150 nm NPB | 20 nm ADN + 1.5% TBP | 20 nm Alq + 0.5% Rubrene | 15 nm Alq | 200 nm MgAg | 9 | 3.31 | 0.27 | 0.316 | Blue-White |
| P | 150 nm NPB | 20 nm ADN + 1.5% TBP | 20 nm Alq + 1% Rubrene | 15 nm Alq | 200 nm MgAg | 9.2 | 2.94 | 0.301 | 0.334 | White |
| Q | 150 nm NPB | 20 nm ADN + 1.5% TBP | 20 nm Alq + 2% Rubrene | 15 nm Alq | 200 nm MgAg | 9.2 | 2.55 | 0.327 | 0.347 | White |
| R | 150 nm NPB | 20 nm ADN + 1.5% TBP | 20 nm Alq + 5% Rubrene | 15 nm Alq | 200 nm MgAg | 9.2 | 1.99 | 0.338 | 0.351 | White |

It was also found that that the rubrene doped region of the Alq electron transport layer 343a should be in close contact with the blue luminescent layer 342 for obtaining high efficiency white light producing OLED devices. This is illustrated by the following Example 4.

EXAMPLE 4

OLED devices S to X were prepared by inserting varying thickness of undoped Alq between the blue emission layer numbers for other layers are the same as corresponding to FIG. 3. An organic white light-emitting structure 940 is formed between the anode 220 and a cathode 230. The white light-emitting structure 940 is comprised of, in sequence, an organic hole-transporting layer 341a doped with rubrene, an organic light-emitting layer 342 which is blue emitting layer comprising ADN host and TBP dopant, and an organic electron-transporting layer 343a which is made of Alq and is doped with rubrene yellow dopant.

TABLE 4

White OLED by Rubrene doping in ETL

| Device # | HTL layer | Blue emission layer | AlQ undoped | ETL Alq doped with 2% rubrene | ETL Alq undoped | Cathode | Drive Volt. (V) | Luminance Yield (cd/A) | CIEX | CIEy | Color |
|---|---|---|---|---|---|---|---|---|---|---|---|
| S | 150 nm NPB | 20 nm ADN + 1.5% TBP | 0 nm | 0 nm | 35 nm | 200 nm MgAg | 7.4 | 2.68 | 0.156 | 0.254 | Blue |
| T | 150 nm NPB | 20 nm ADN + 1.5% TBP | 0 nm | 5 nm | 30 nm | 200 nm MgAg | 7.7 | 2.97 | 0.267 | 0.321 | White |
| U | 150 nm NPB | 20 nm ADN + 1.5% TBP | 1 nm | 5 nm | 29 nm | 200 nm MgAg | 7.7 | 3.34 | 0.247 | 0.313 | White-Blue |
| V | 150 nm NPB | 20 nm ADN + 1.5% TBP | 2 nm | 5 nm | 25 nm | 200 nm MgAg | 7.6 | 3.29 | 0.233 | 0.303 | White-Blue |

TABLE 4-continued

White OLED by Rubrene doping in ETL

| Device # | HTL layer | Blue emission layer | AIQ undoped | ETL Alq doped with 2% rubrene | ETL Alq undoped | Cathode | Drive Volt. (V) | Luminance Yield (cd/A) | CIEX | CIEy | Color |
|---|---|---|---|---|---|---|---|---|---|---|---|
| W | 150 nm NPB | 20 nm ADN + 1.5% TBP | 5 nm | 5 nm | 25 nm | 200 nm MgAg | 7.3 | 2.74 | 0.242 | 0.295 | White-Blue |
| X | 150 nm NPB | 20 nm ADN + 1.5% TBP | 10 nm | 5 nm | 20 nm | 200 nm MgAg | 6.3 | 1.13 | 0.143 | 0.184 | Blue |

Figure 10:
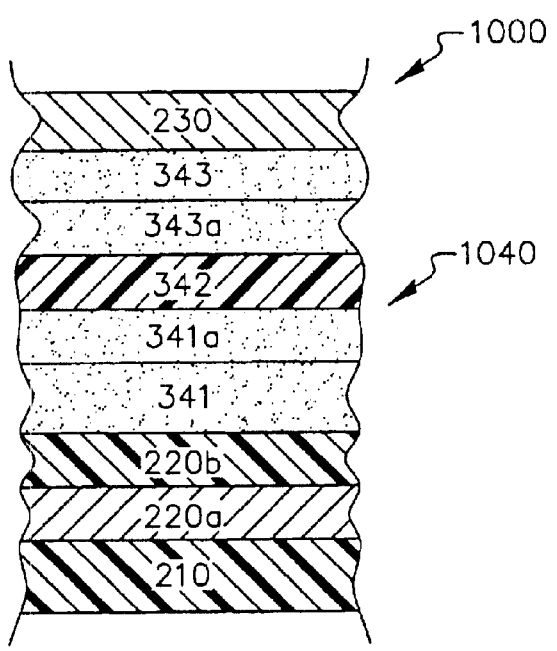
FIG. 10 depicts another structure of white light producing OLED device wherein rubrene doping in both the hole transport layer and the electron transport layer.

FIG. 10 depicts yet another structure of organic white light-emitting OLED device 1000. This structure is similar to that shown in FIG. 9 except that the organic multilayer structure 1040 has an organic hole-transporting layer consisting of two layers, layer 341 which is made of undoped NPB and layer 341a which is NPB doped with rubrene. Similarly organic electron-transporting layers can be made of either a single layer of rubrene-doped Alq or consisting of two layers such as rubrene doped Alq 343a and undoped Alq layer 343.

EXAMPLE 5

Figure 11:
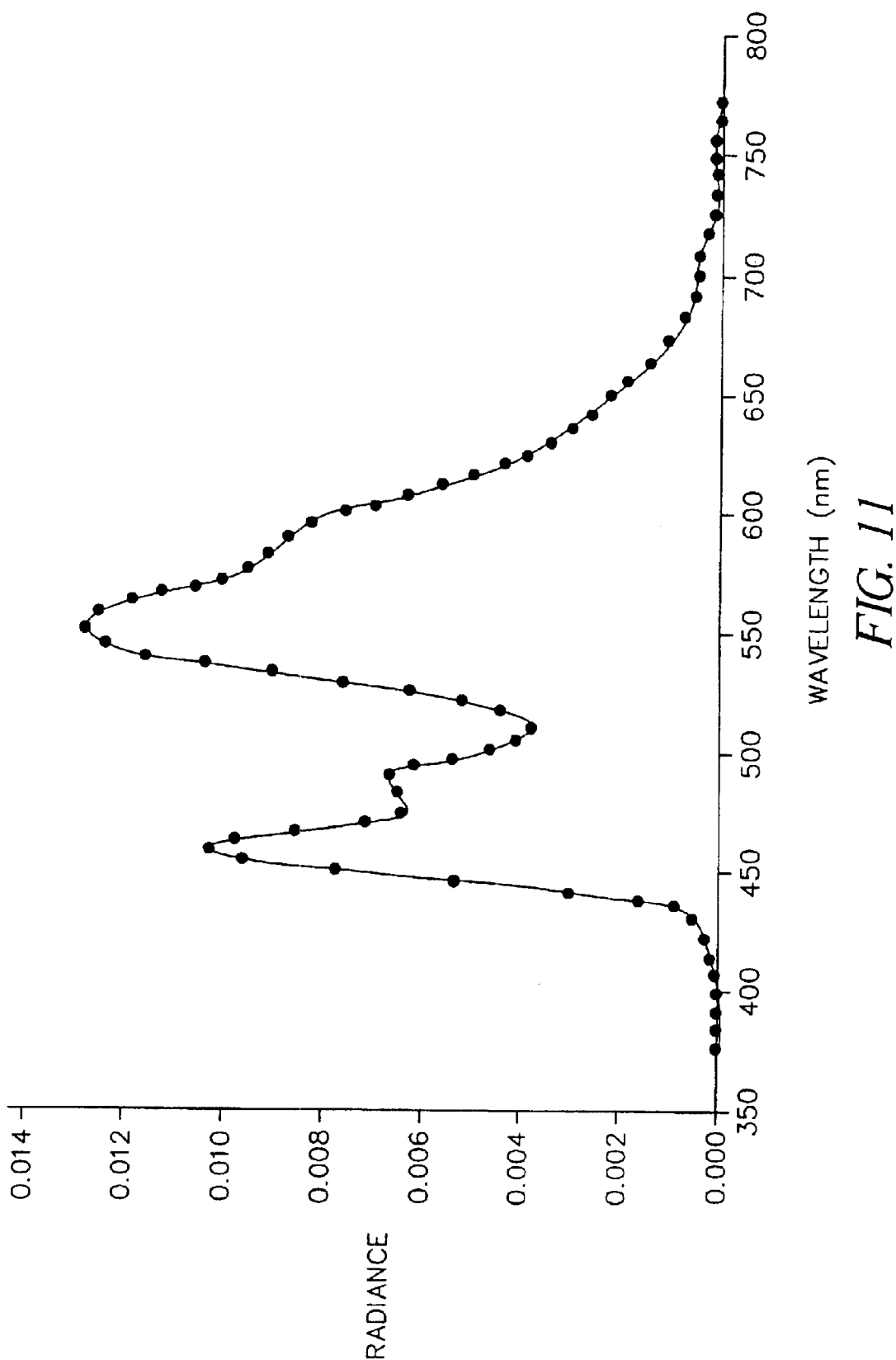
FIG. 11 shows a graph of EL spectra wherein rubrene yellow doping both in hole transport and the electron transport layers.

Devices AA to AF were prepared following the device structures shown in FIGS. 4, 7 and 10. FIG. 11 shows the EL spectra of one of the device AF wherein rubrene was doped both in the NPB hole transport layer as well as Alq electron transport layer adjacent to the blue emitting layer.

Figure 12:
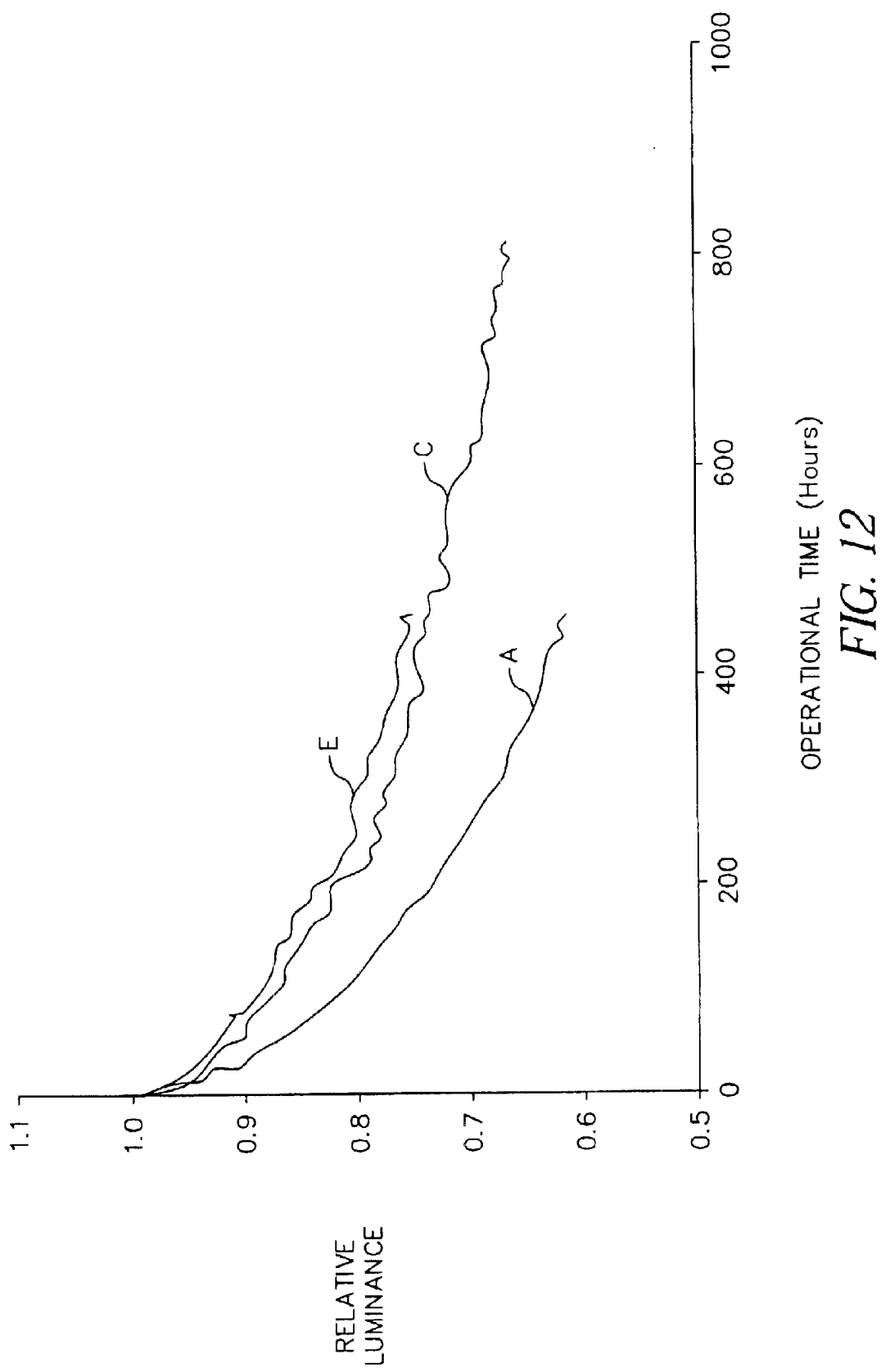
FIG. 12 shows relative luminance change as a function of operation time for the three devices with (A) no rubrene and (C) 0.5% rubrene, and (E) 2.0% rubrene doping into HTL layer.

The luminance efficiency and the CIE coordinates as a function of rubrene concentration for devices AA to AF are FIG. 12 shows the relative luminance of devices A, C and E as a function of operation time at 20-mA/cm2 current density. Device A is a blue device, whereas devices C and E are white devices as described in Example 1 by rubrene doping into the NPB hole transport layer. Devices C and E have superior operation stability than device A.

Figure 13:
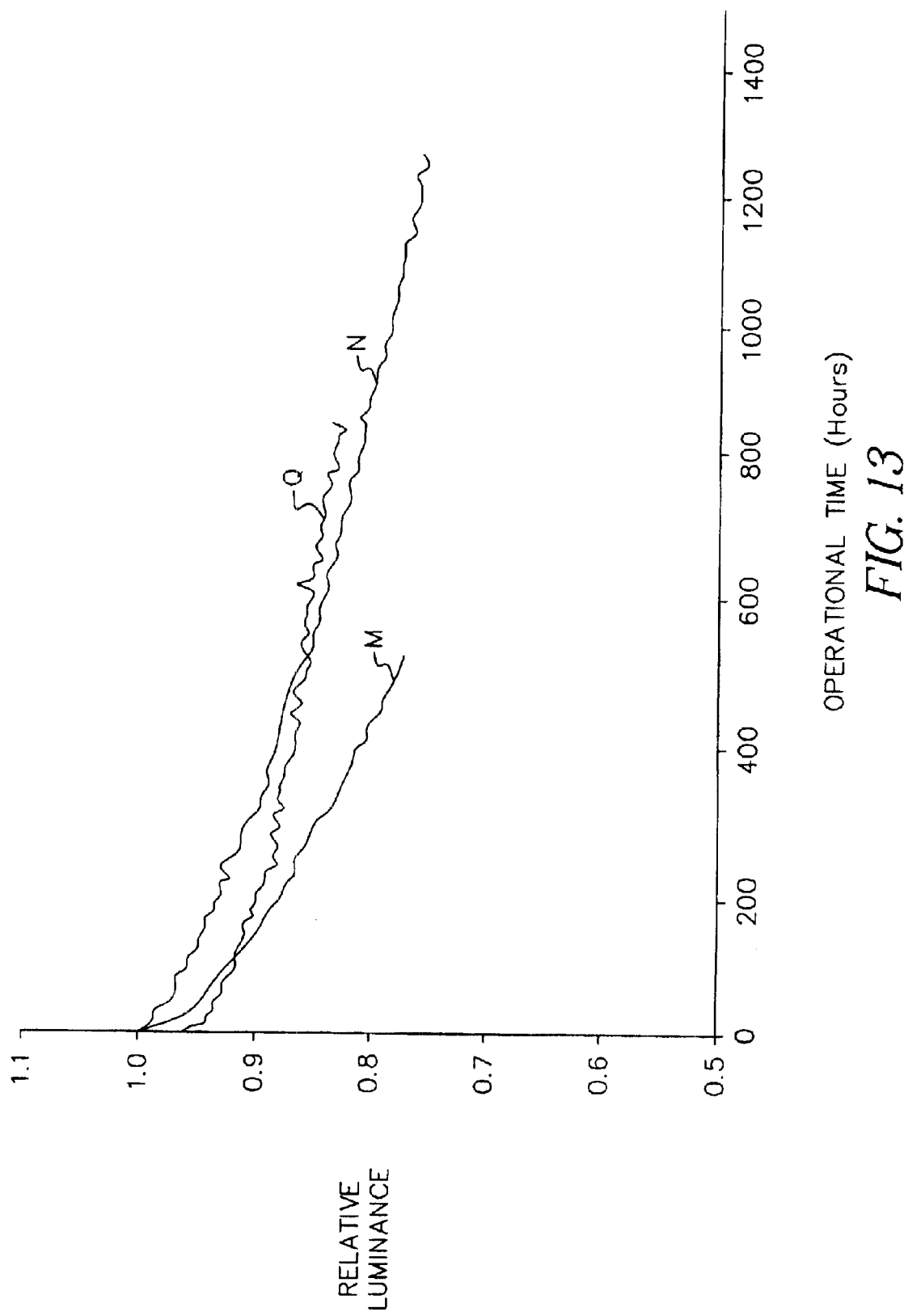
FIG. 13 shows relative luminance change as a function of operation time for the three devices with (M) no rubrene, (N) 0.3% rubrene and (Q) 2.0% rubrene doping in ETL layer.

FIG. 13 shows the operation stability of the devices M, N and Q at 20 mA/cm$^2$ current density. Device M is a blue device, whereas devices N and Q are white devices as described in Example 3 by rubrene doping into the Alq electron transport layer. Devices N and Q have significantly higher operation stability than device M.

TABLE 5

White OLED by Rubrene doping into both NPB HTL and AIQ ETL layers

| Device # | HTL layer | Blue emission layer | AIQ ETL doped with Rubrene % | AIQ ETL undoped | MgAg Cathode | Drive Volt. (V) | Luminance Yield (cd/A) | CIEx | CIEy | Color |
|---|---|---|---|---|---|---|---|---|---|---|
| AA | 150 nm NPB | 20 nm ADN + 1.5% TBP | 20 nm Alq | 15 nm | 200 nm | 8.6 | 2.46 | 0.175 | 0.256 | Blue |
| AB | 150 nm NPB | 20 nm ADN + 1.5% TBP | 20 nm Alq + 0.2% Rubrene doped | 15 nm | 200 nm | 6.6 | 2.54 | 0.184 | 0.229 | Blue |
| AC | 150 nm NPB | 20 nm ADN + 1.5% TBP | 20 nm Alq + 0.5% Rubrene doped | 15 nm | 200 nm | 7.5 | 3.76 | 0.276 | 0.328 | Blue-White |
| AD | 150 nm NPB + 1.5% Rubrene doped | 20 nm ADN + 1.5% TBP | 20 nm Alq | 15 nm | 200 nm | 7.4 | 4.5 | 0.33 | 0.38 | White |
| AE | 150 nm NPB + 1.5% Rubrene doped | 20 nm ADN + 1.5% TBP | 20 nm Alq + 0.2% Rubrene doped | 15 nm | 200 nm | 7.4 | 5.3 | 0.35 | 0.38 | White |
| AF | 150 nm NPB + 1.5% Rubrene doped | 20 nm ADN + 1.5% TBP | 20 nm Alq + 0.5% Rubrene doped | 15 nm | 200 nm | 7.5 | 5.2 | 0.36 | 0.38 | White | shown in Table 5. Devices AE and AF have luminance yield of 5.3 cd/A and color chromaticity coordinates of CIE x,y=0.35, 0.38 @20 mA/cm2 current density. This luminance efficiency is higher than the white OLED devices obtained by rubrene doping either in the NPB hole transport layer or in the Alq electron transport layer.

Figure 14:
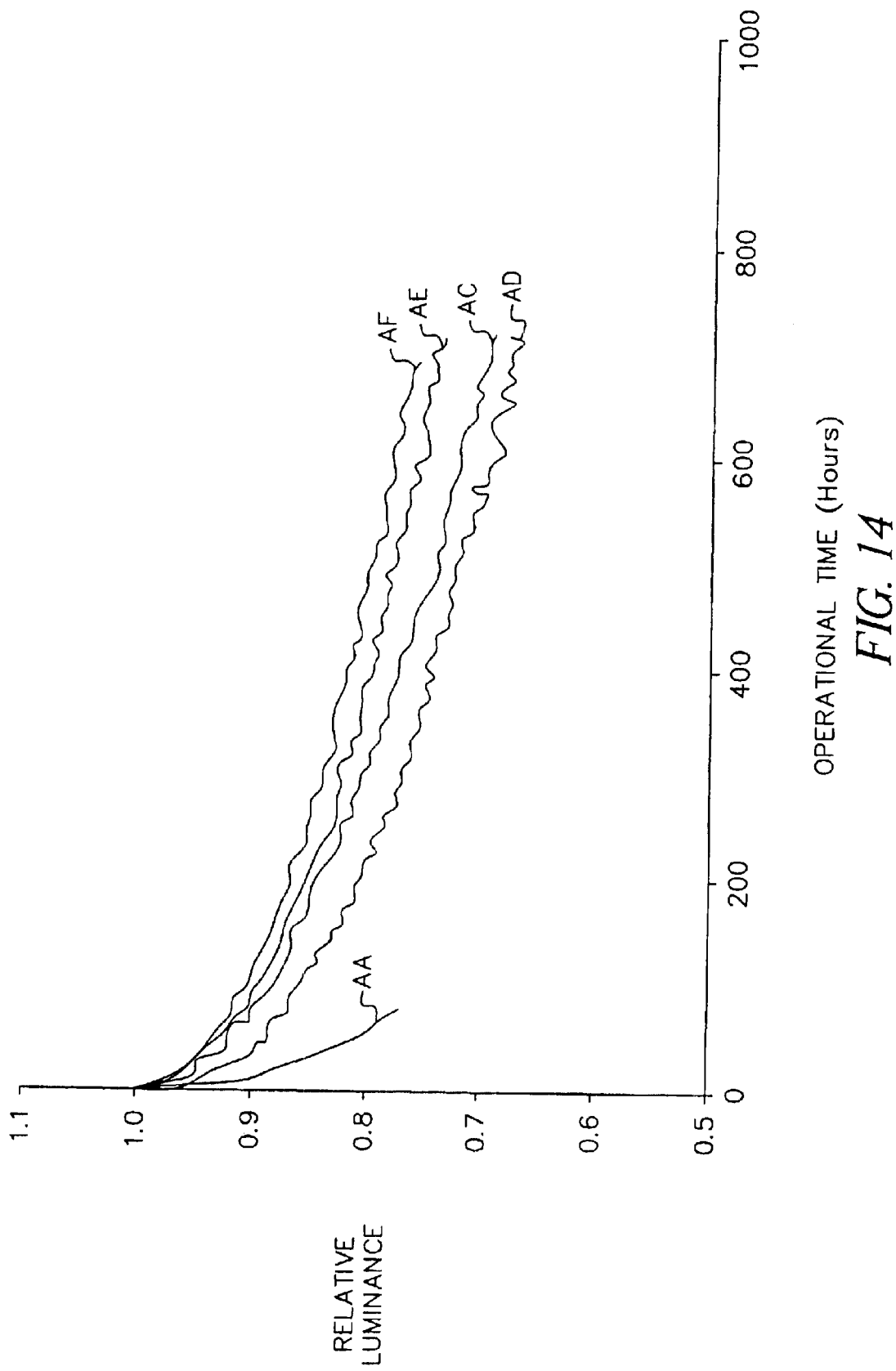
FIG. 14 shows relative luminance change as a function of operation time for the five devices: (AA) Blue device, (AC) 0.5% doping into ETL layer, (AD) White OLED with 1.5% rubrene doping in HTL layer; (AE) and (AF) White OLED devices with rubrene doping both in HTL and ETL layers.

The operational stability of the encapsulated OLED devices in ambient environments was found by measuring the changes in the drive voltage and the luminance as a function of time when OLED devices were operated at a constant current density of 20 mA/cm$^2$. White OLED devices prepared by following the different structures of this invention have high operational stability. FIGS. 12 to 14 shows the operational luminance stability for these devices.

FIG. 14 shows the operational stability of the devices AA, AC, AD, AE, and AF at 20 mA/cm2 current density. These devices are described in Example 5. Device AA is a blue device. Device AC and AD are white devices obtained by doping rubrene into Alq electron transport layer and NPB hole transport layer, respectively. Devices AE and AF are also white devices, except that the yellow rubrene was doped both in the NPB hole transport layer and the Alq electron transport layer. Unexpectedly, the Devices AE and AF showed minimal change in the luminance and the drive voltage. Thus, these devices have the highest operational stability among the five OLED devices. When rubrene was doped both in the NPB hole transport layer as well as Alq electron transport layer adjacent to the blue emission layer, the synergistic effect was such that significantly better operational stability and efficiency were obtained for the white OLED devices.

Thus, the white OLED devices of this invention prepared by doping rubrene into either NPB hole transport layer or the electron transport layer, or both, the hole transport layer and the electron transport layer have significantly improved operational fade stability. These OLED devices have higher luminance yield and lower drive voltage. These OLED devices can be operated at higher current density with minimum degradation in the color coordinates and the luminance efficiency.

The invention has been described in detail with particular reference to certain preferred embodiments thereof, but it will be understood that variations and modifications can be effected within the spirit and scope of the invention.

PARTS LIST

100 OLED device
120 anode contact
130 cathode contact
140 light-emitting layer
200 OLED device
220 transparent anode
220a transparent anode layer
220b thin fluorocarbon layer
230 cathode contact
240 organic multilayer structure
241 organic hole transport layer
242 organic electroluminescent layer
243 organic electron transport layer
300 OLED device
340 organic multilayer structure
341 organic hole transport layer
341a organic hole transport layer
342 organic electroluminescent layer
343 organic electron transport layer
343a organic electron transport layer
400 OLED device
440 organic multilayer structure
600 OLED device
640 organic multilayer structure
700 OLED device
740 organic multilayer structure
900 OLED device
940 organic multilayer structure
1000 OLED device
1040 organic multilayer structure

What is claimed is:

1. An organic light-emitting diode (OLED) device which produces white light, comprising:
    a) a substrate;
    b) an anode disposed over the substrate;
    c) a hole-injecting layer disposed over the anode;
    d) a hole transport layer disposed over the hole-injecting layer;
    e) a light-emitting layer doped with a blue light-emitting compound, disposed directly on the hole transport layer;
    f) an electron transport layer disposed over the blue light-emitting layer;
    g) a cathode disposed over the electron transport layer; and
    h) the hole transport layer, electron transport layer, or the electron transport layer and the hole transport layer being selectively doped in a region which corresponds to an entire layer or a partial portion of a layer in contact with the blue light-emitting layer, the selective doping being with a compound which emits light in the yellow region of the spectrum.

2. The OLED device of claim 1 wherein the compound which emits light in the yellow region includes a rubrene compound.

3. The OLED device according to claim 1 wherein the hole transport layer includes an aromatic tertiary amine.

4. The OLED device according to claim 1 wherein the electron transport layer includes tris(8-hydroxy quinolinol) aluminum.

5. The OLED device according to claim 1 wherein the electron transport layer includes copper phthalocyanin compound.

6. The OLED device according to claim 1 wherein the light-emitting layer doped with a blue light-emitting compound includes host material selected from the group consisting of:

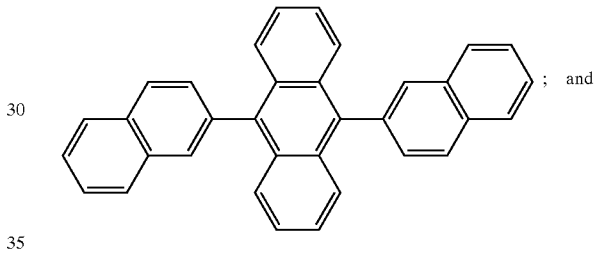

; and

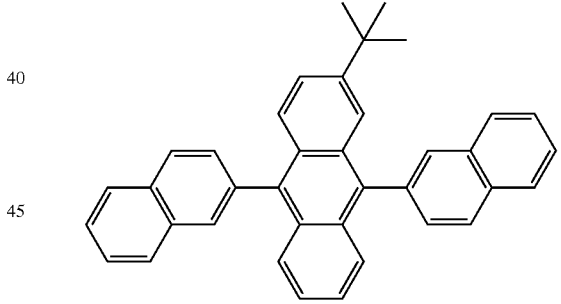

.

7. The OLED device according to claim 1 wherein the light-emitting layer doped with a blue light-emitting compound includes the blue dopant selected from the group consisting of:

i) perylene

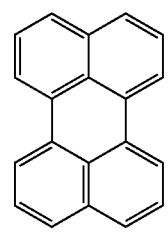

ii) 2,5,8,11-tetra-tert-butyl perylene

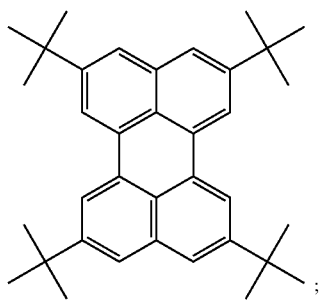

and iii) a conjugated benzenoid including

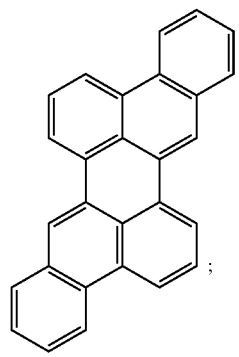

8. The OLED device according to claim 2 wherein concentration of the rubrene compound is between 0.1–10% percent of the host material.

9. The OLED device according to claim 1 wherein the concentration of the blue light-emitting compound is between 0.1–10% percent of a host material.

10. The OLED device according to claim 1 wherein thickness of the hole transport layer is between 20 nm–300 nm.

11. The OLED device according to claim 2 wherein thickness of the light emitting layer doped with the blue light emitting compound is between 10 nm–100 nm.

12. The OLED device according to claim 2 wherein thickness of the electron transport layer is between 10 nm–150 nm.

13. The OLED device according to claim 2 wherein the cathode is selected from the grow of LiF/Al, Mg:Ag alloy, and Al—Li alloy.

14. The OLED device according to claim 2 wherein the cathode is transparent.

15. The OLED device according to claim 2 wherein the electron transport layer is transparent.

16. An organic light-emitting diode (OLED) device which produces white light, comprising:
    a) a substrate;
    b) an anode disposed over the substrate;
    c) a hole-injecting layer disposed over the anode;
    d) a hole transport layer disposed over the hole-injecting layer and doped with a compound for emitting light in the yellow region of the spectrum;
    e) a light-emitting layer doped with a blue light-emitting compound disposed directly on the hole transport layer;
    f) an electron transport layer disposed over the blue light-emitting layer; and
    g) a cathode disposed over the electron transport layer.

17. An organic light-emitting diode (OLED) device which produces white light, comprising:
    a) a substrate;
    b) an anode disposed over the substrate;
    c) a hole-injecting layer disposed over the anode;
    d) a hole transport layer doped with a rubrene compound for emitting light in the yellow region of the spectrum;
    e) a light-emitting layer doped with a blue light-emitting compound, disposed directly on the hole transport layer;
    f) an electron transport layer disposed over the blue light-emitting layer; and
    g) a cathode disposed over the electron transport layer.

18. The OLED device according to claim 17 wherein the hole transport layer includes an aromatic tertiary amine.

19. The OLED device according to claim 17 wherein the electron transport layer includes tris(8-hydroxy quinolinol) aluminum.

20. The OLED device according to claim 17 wherein the electron transport layer includes copper phthalocyanine compound.

21. The OLED device according to claim 17 wherein the light-emitting layer doped with a blue light-emitting compound includes host material selected from the group consisting of:

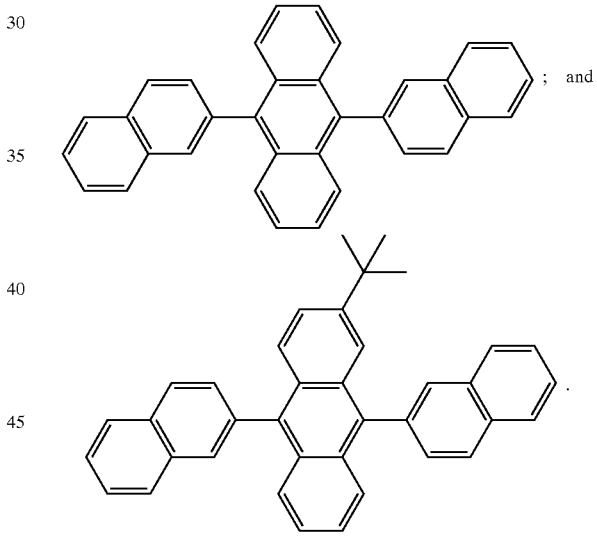

22. The OLED device according to claim 17 wherein the light-emitting layer doped with a blue light-emitting compound includes the blue dopant selected from the group consisting of:

i) perylene

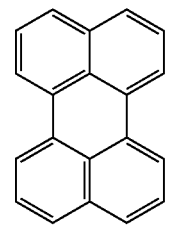

ii) 2,5,8,11-tetra-tert-butyl perylene

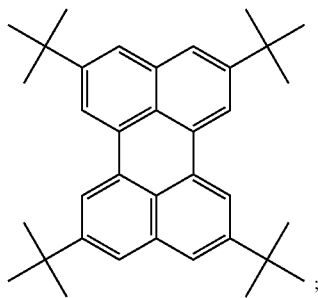

and
iii) a conjugated benzenoid including

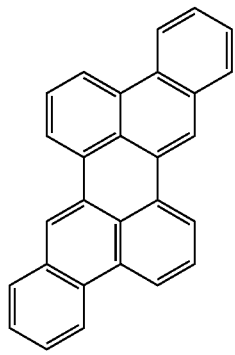

23. The OLED device according to claim 17 wherein concentration of the rubrene compound is between 0.1–10% percent of the host material.

24. The OLED device according to claim 17 wherein the concentration of the blue light-emitting compound is between 0.1–10% percent of a host material.

25. The OLED device according to claim 17 wherein thickness of the hole transport layer is between 20 nm–300 nm.

26. The OLED device according to claim 17 wherein thickness of the light emitting layer doped with the blue light emitting compound is between 10 nm–100 nm.

27. The OLED device according to claim 17 wherein thickness of the electron transport layer is between 10 nm–150 nm.

28. The OLED device according to claim 17 wherein the cathode is selected from the group of LiF/Al, Mg:Ag alloy, and Al—Li alloy.

29. The OLED device according to claim 17 wherein the cathode is transparent.

30. The OLED device according to claim 17 wherein the electron transport layer is transparent.

31. An organic light-emitting diode device which produces white light, comprising:
   a) a substrate;
   b) an anode disposed over the substrate;
   c) a hole-injecting layer disposed over the anode;
   d) a hole transport layer disposed over the hole-injecting layer;
   e) a light-emitting layer doped with a blue light-emitting compound, disposed directly on the hole transport layer;
   f) an electron transport layer doped with a compound for emitting light in the yellow region of the spectrum and disposed directly over the blue light-emitting layer; and
   g) a cathode disposed over the electron transport layer.

32. An organic light-emitting diode device which produces white light, comprising:
   a) a substrate;
   b) an anode disposed over the substrate;
   c) a hole-injecting layer disposed over the anode;
   d) a hole transport layer disposed over the hole-injecting layer;
   e) a light-emitting layer doped with a blue light-emitting compound, disposed directly on the hole transport layer;
   f) an electron transport layer doped with a rebrene compound for emitting light in the yellow region of the spectrum and disposed directly over the blue light-emitting layer; and
   g) a cathode disposed over the electron transport layer.

33. The OLED device according to claim 32 wherein the hole transport layer includes an aromatic tertiary amine.

34. The OLED device according to claim 32 wherein the electron transport layer includes tris(8-hydroxy quinolinol) aluminum.

35. The OLED device according to claim 32 wherein the electron transport layer includes copper phthalocyanine compound.

36. The OLED device according to claim 32 wherein the light-emitting layer doped with a blue light-emitting compound includes host material selected from the group consisting of:

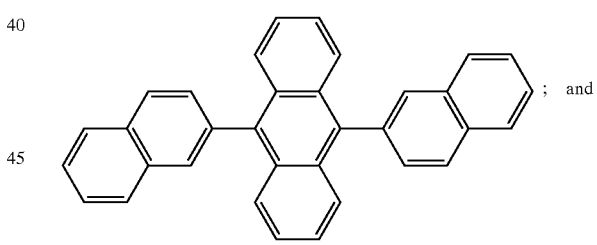 ; and

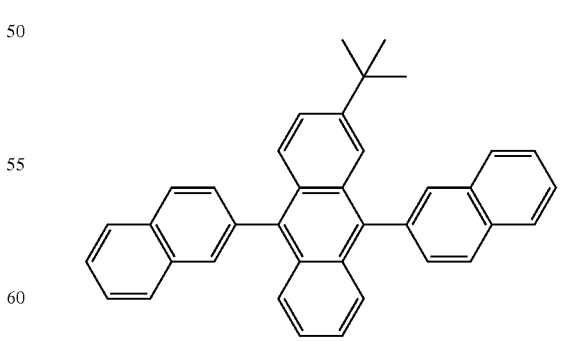 .

37. The OLED device according to claim 32 wherein the light-emitting layer doped with a blue light emitting compound includes the blue dopant selected from the group consisting of:

i) perylene

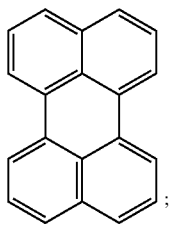

ii) 2,5,8,11-tetra-tert-butyl perylene

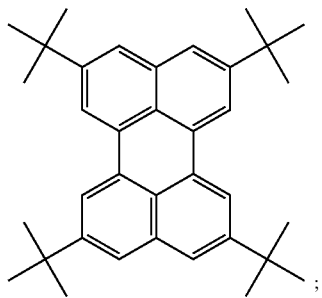

and
iii) a conjugated benzenoid including

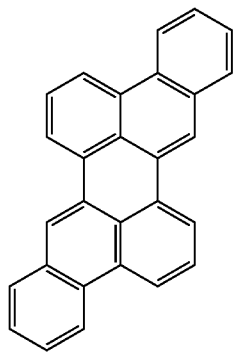

38. The OLED device according to claim 32 wherein concentration of the rubrene compound is between 0.1–10% percent of the host material.

39. The OLED device according to claim 32 wherein the concentration of the blue light-emitting compound is between 0.1–10% percent of a host material.

40. The OLED device according to claim 32 wherein thickness of the hole transport layer is between 20–300 nm.

41. The OLED device according to claim 32 wherein thickness of the blue light emission layer is between 10–100 nm.

42. The OLED device according to claim 32 wherein thickness of the electron transport layer is between 100–150 nm.

43. The OLED device according to claim 32 wherein the hole transport layer is aromatic tertiary amines.

44. The OLED device according to claim 32 wherein the electron transport layer is tris(8-hydroxy quinolinol) aluminum.

45. The OLED device according to claim 32 wherein the electron transport layer is made of copper phthalocyanine compound.

46. The OLED device according to claim 32 wherein the cathode is selected from the group LiF/Al, Mg:Ag alloy, and Al—Li alloy.

47. The OLED device according to claim 32 wherein the cathode is transparent.

48. The OLED device according to claim 32 wherein the electron transport layer is transparent.

49. An organic light-emitting diode device which produces white light, comprising:
 a) a substrate;
 b) an anode disposed over the substrate;
 c) a hole-injecting layer disposed over the anode;
 d) a hole transport layer disposed over the hole-injecting layer doped with a compound for emitting light in the yellow region of the spectrum;
 e) a light-emitting layer doped with a blue light-emitting compound, disposed directly on the hole transport layer;
 f) an electron transport layer doped with a yellow compound for emitting light in the yellow region of the spectrum and disposed directly over the blue light-emitting layer; and
 g) a cathode disposed over the electron transport layer.

50. An organic light-emitting diode device which produces white light, comprising:
 a) a substrate;
 b) an anode disposed over the substrate;
 c) a hole-injecting layer disposed over the anode;
 d) a hole transport layer doped with a rubrene compound for emittng light in the yellow region of the spectrum;
 e) a light-emitting layer doped with a blue light-emitting compound, disposed directly on the hole transport layer;
 f) an electron transport layer doped with a rubrene compound for emitting light in the yellow region of the spectrum and disposed directly over the blue light-emitting layer; and
 g) a cathode disposed over the electron transport layer.

51. The OLED device according to claim 50 wherein the hole transport layer includes an aromatic tertiary amine.

52. The OLED device according to claim 50 the electron transport layer includes tris(8-hydroxy quinolinol) aluminum.

53. The OLED device according to claim 50 wherein the electron transport layer includes copper phthalocyanin compound.

54. The OLED device according to claim 50 wherein the light-emitting layer doped with a blue light-emitting compound includes host material selected from the group consisting of:

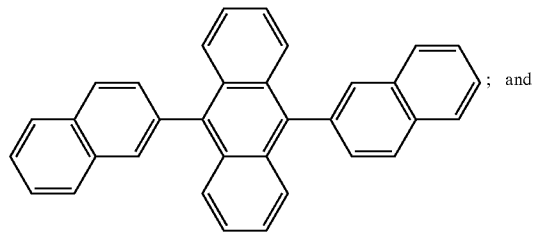

; and

-continued

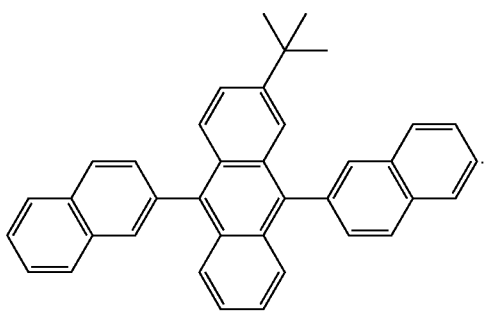

55. The OLED device according to claim 50 wherein the light-emitting layer doped with a blue light-emitting compound includes the blue dopant selected from the group consisting of:

i) perylene

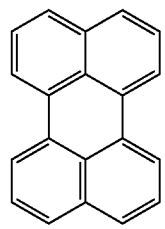

ii) 2,5,8,11-tetra-tert-butyl perylene

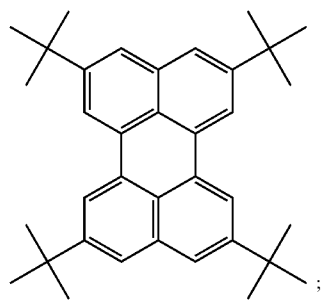

and
iii) a conjugated benzenoid including

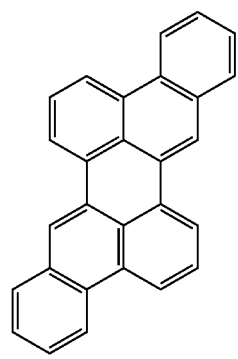

56. The OLED device according to claim 50 wherein concentration of the rubrene compound is between 0.1–10% percent of the host material.

57. The OLED device according to claim 50 wherein the concentration of the blue light-emitting compound is between 0.1–10% percent of a host material.

58. The OLED device according to claim 50 wherein thickness of the hole transport layer is between 20–300 nm.

59. The OLED device according to claim 50 wherein thickness of the light emitting layer doped with the blue light emitting compound is between 10–100 nm.

60. The OLED device according to claim 50 wherein thickness of the electron transport layer is between 100–150 nm.

61. The OLED device according to claim 41 wherein the cathode is selected from the group LiF/Al, Mg:Ag alloy, and Al—Li alloy.

62. The OLED device according to claim 50 wherein the cathode is transparent.

63. The OLED device according to claim 50 wherein the electron transport layer is transparent.

64. The OLED device according to claim 50 further including an undoped electron transport layer disposed on the doped electron transport layer.

65. The OLED device according to claim 32 further including an undoped electron transport layer disposed on the doped electron transport layer.

66. The OLED device according to claim 17 further including an undoped hole transport layer disposed on the anode.

67. The OLED device according to claim 50 further including an undoped hole transport layer disposed on the anode.

68. An organic light-emitting diode (OLED) device which produces white light, comprising:

a) a substrate;

b) an anode disposed over the substrate;

c) a hole transport layer;

d) a light-emitting layer doped with a blue light-emitting compound, disposed directly on the hole transport layer;

e) an electron transport layer disposed over the blue light-emitting layer;

f) a cathode disposed over the electron transport layer; and g) the hole transport layer, electron transport layer, or the electron transport layer and the hole transport layer being selectively doped in a region which corresponds to an entire layer or a partial portion of a layer in contact with the blue light-emitting layer, the selective doping being with a compound which emits light in the yellow region of the spectrum.

* * * * *